(12) United States Patent
Han

(10) Patent No.: US 7,078,912 B2
(45) Date of Patent: Jul. 18, 2006

(54) TECHNIQUES TO TEST SIGNAL PROPAGATION MEDIA

(75) Inventor: Chunming Han, Manalapan, NJ (US)

(73) Assignee: Intel Corporation, Santa Clara, CA (US)

( * ) Notice: Subject to any disclaimer, the term of this patent is extended or adjusted under 35 U.S.C. 154(b) by 224 days.

(21) Appl. No.: 10/456,076

(22) Filed: Jun. 6, 2003

(65) Prior Publication Data

US 2004/0246006 A1    Dec. 9, 2004

(51) Int. Cl.
*G01R 31/11*    (2006.01)
(52) U.S. Cl. ...................................... 324/534
(58) Field of Classification Search ............... 324/534, 324/527, 531–535, 539, 616; 379/22.03, 379/27.01
See application file for complete search history.

(56) References Cited

U.S. PATENT DOCUMENTS

| | | | |
|---|---|---|---|
| 3,701,943 A | | 10/1972 | Kaiser |
| 6,104,197 A | * | 8/2000 | Kochan ................... 324/533 |
| 6,298,118 B1 | * | 10/2001 | Liggett ...................... 379/21 |

| | | | |
|---|---|---|---|
| 2003/0020898 A1 | | 1/2003 | Wyar |

FOREIGN PATENT DOCUMENTS

EP    0 882 993 A2    12/1998

OTHER PUBLICATIONS

PCT International Search Report and Written Opinion for PCT International Application No. US2004/016587, mailed Oct. 4, 2004 (11 pages).
The Intellectual Property Bureau, Ministry of Economic Affairs, Official Latter regarding R.O.C. Patent Application No. 93115086 (English translation provided by Saint Island International Patent and Law Offices), 1 page, May 11, 2005.

* cited by examiner

*Primary Examiner*—Diane Lee
*Assistant Examiner*—Hoai-An D. Nguyen
(74) *Attorney, Agent, or Firm*—Glen B. Choi

(57) ABSTRACT

Briefly, techniques that may be used to provide characteristics of a signal propagation medium. Based on test signals transmitted into the medium, the techniques may be used to construct a mosaic waveform with multiple time segments. Each time segment may be based on a gain enhanced received reflected signal and each time segment may have an applied gain that is at a highest level without causing saturation. The techniques may further remove unwanted bridge tap reflection.

18 Claims, 3 Drawing Sheets

TECHNIQUES TO TEST SIGNAL PROPAGATION MEDIA

FIELD

The subject matter disclosed herein generally relates to techniques to test signal propagation media.

DESCRIPTION OF RELATED ART

Signal propagation media may be used to transmit signals in a communications system. Examples of signal propagation media include a twisted copper pair cable, fiber optic cable, and coaxial cable. One manner to test a signal propagation medium is to apply an impulse test signal and to analyze a reflected signal resulting from the test signal.

There are several well-known techniques to measure the characteristics of a signal propagation medium. One technique is known as ultra sound imaging whereby the gain applied to the reflected signal is increased over time. One drawback with this technique is that linear time-invariant filters typically used to filter the reflected signal cannot adequately filter a reflected signal with applied gain that increases over time. Another technique involves applying a constant high gain to the reflected signal. However, such high gain technique may saturate portions of the reflected signal. Yet another technique involves applying a constant medium level gain to the reflected signal. However this technique of applying a constant medium level gain technique may suffer from quantization error whereby portions of the reflected signal with a small amplitude may not be resolved clearly after being converted from analog to digital formats.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Note that use of the same reference numbers in different figures indicates the same or like elements.

DETAILED DESCRIPTION

Figure 1:
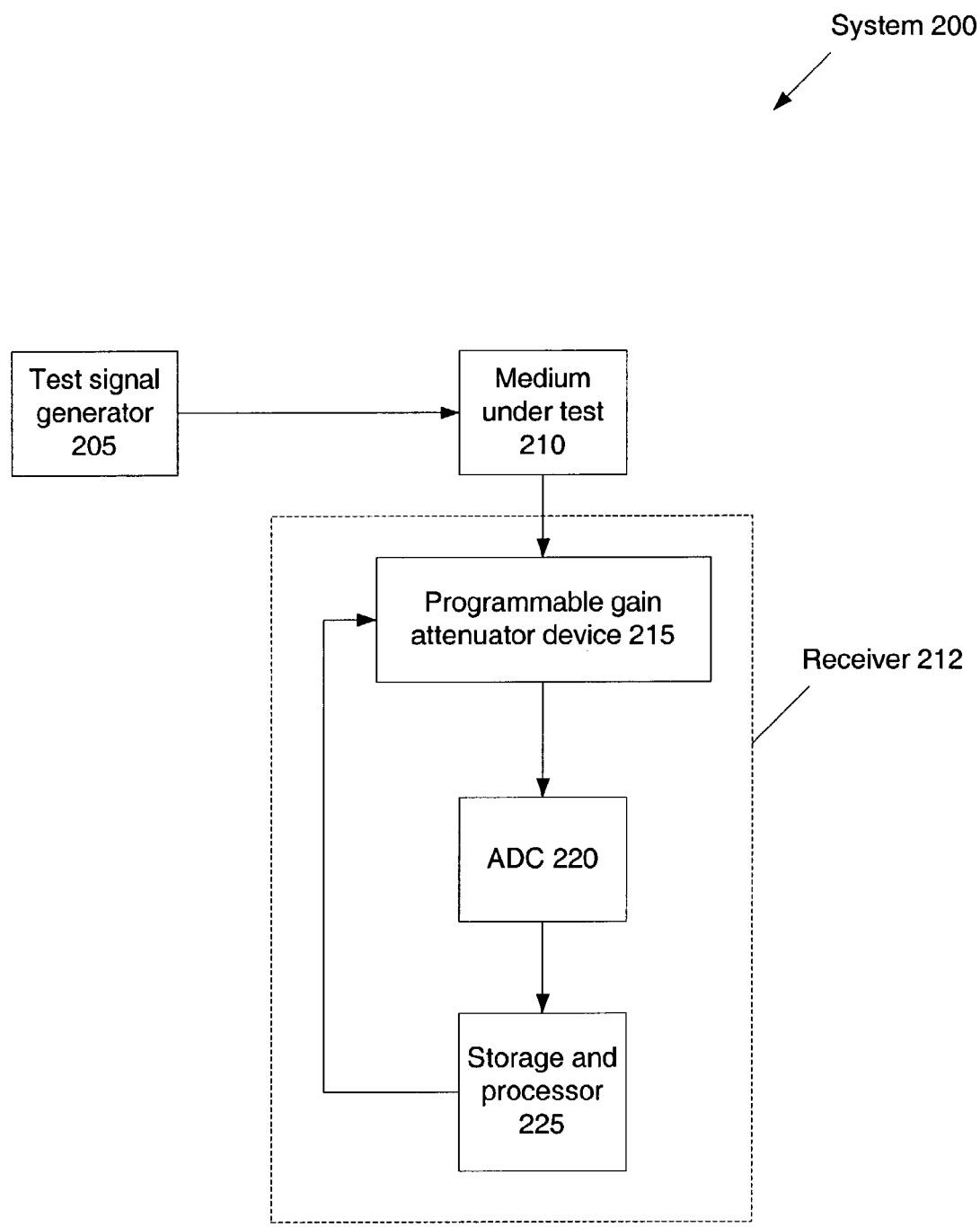
FIG. 1 depicts a system that can be used in an embodiment of the present invention.

FIG. 1 depicts a system 200 that can be used in an embodiment of the present invention. System 200 may include: test signal generator 205, medium under test (MUT) 210, and receiver 212. For example, test signal generator 205 may output test signals to the MUT 210. The test signal may be an impulse signal. MUT 210 may be implemented as a twisted pair copper cable, coaxial cable, power transmission line, fiber optical cable, or any signal propagation medium. MUT 210 may reflect a test signal transmitted by test signal generator 205 to receiver 212. For example, MUT 210 may be configured in open or shorted loop manners. Test signal generator 205 and receiver 212 may be implemented as hardwired logic, software stored by a memory device and executed by a microprocessor, firmware, an application specific integrated circuit (ASIC), and/or a field programmable gate array (FPGA).

Receiver 212 may provide characteristics of MUT 210 based on test signals transmitted through MUT 210 by test signal generator 205. One embodiment of receiver 212 may include programmable gain attenuation device 215, analog-to-digital converter (ADC) 220, and storage and processor device 225. Programmable gain attenuation device 215 may receive a reflected signal from MUT 210. Programmable gain attenuation device 215 may apply a programmable gain to the received reflected signal where the gain level may be based on the extent to which the received reflected signal saturates. Programmable gain attenuation device 215 may provide the amplified received reflected signal to ADC 220. ADC 220 may convert a format of the amplified received reflected signal from programmable gain attenuation device 215 from analog to digital format.

Storage and processor device 225 may adjust the gain applied by programmable gain attenuation device 215 based on saturation of the amplified reflected signal. For example, storage and processor device 225 may command programmable gain attenuation device 215 to lower an applied gain if a portion of the amplified reflected signal saturates. Storage and processor device 225 may store the digital format amplified received reflected signal. For example in one implementation, test signal generator 205 may transmit multiple test signals to MUT 210 and storage and processor device 225 may average received reflection signals for the same applied gain level.

Storage and processor device 225 may assemble and store a mosaic amplified reflected signal that is continuous in the time domain, where different time portions of the mosaic amplified reflected signal may have a maximum level of gain that can be applied by programmable gain attenuation device 215 without saturation of the received reflected signal. Accordingly, test signal generator 205 may generate test signals until the storage and processor device 225 stores a mosaic amplified reflected signal where different time portions of the amplified reflected signal have a maximum level of gain that can be applied by programmable gain attenuation device 215 without saturation of the received reflected signal.

Figure 2:
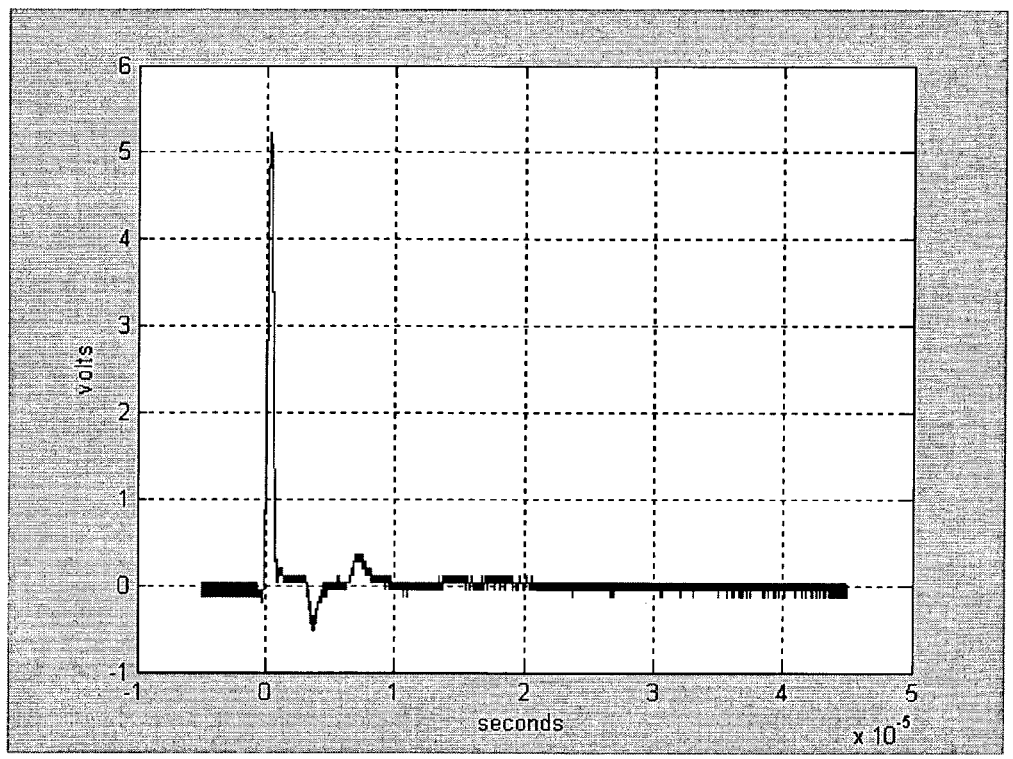
FIG. 2 depicts a sample reflection signal.

For example, referring to FIG. 2, a portion of the sample signal from 0 to approximately $0.2 \times 10^{-5}$ seconds may have a first gain applied; a portion from approximately $0.2 \times 10^{-5}$ to approximately $1 \times 10^{-5}$ seconds may have a second gain applied; and a portion from approximately $1 \times 10^{-5}$ to approximately $5 \times 10^{-5}$ seconds may have a third gain applied, where the first, second, and third gain characteristics may differ but are at maximum levels of gain that can be applied by programmable gain attenuation device 215 without saturation of the received reflected signal. For example, the third gain level may be higher than the second gain.

The digital mosaic signal stored by storage and processor device 225 may be analyzed by a technician or computer. For example, time domain reflectometry (TDR) may be applied to the mosaic signal to determine a physical length of the MUT 210. If the MUT is a pair of twisted copper wires, the thickness of the wires can be determined.

Receiver 212 may measure characteristics of reflected signals from MUT 210 for MUT 210 in both shorted and open loop configurations. A shorted loop configuration may invert and reflect a test signal transmitted by test signal generator 205 whereas an open loop configuration may reflect without inversion a test signal transmitted by test signal generator 205. The reflected signals from open and shorted loops can be subtracted to remove unwanted reflection associated with an untargeted bridged tap in the MUT 210. For example, an untargeted bridge tap may be a juncture where another modem, whose properties are not being measured, can be connected to the MUT 210. Unwanted reflection associated with an untargeted bridged tap may be reflection resulting from the untargeted bridged tap.

Figure 3:
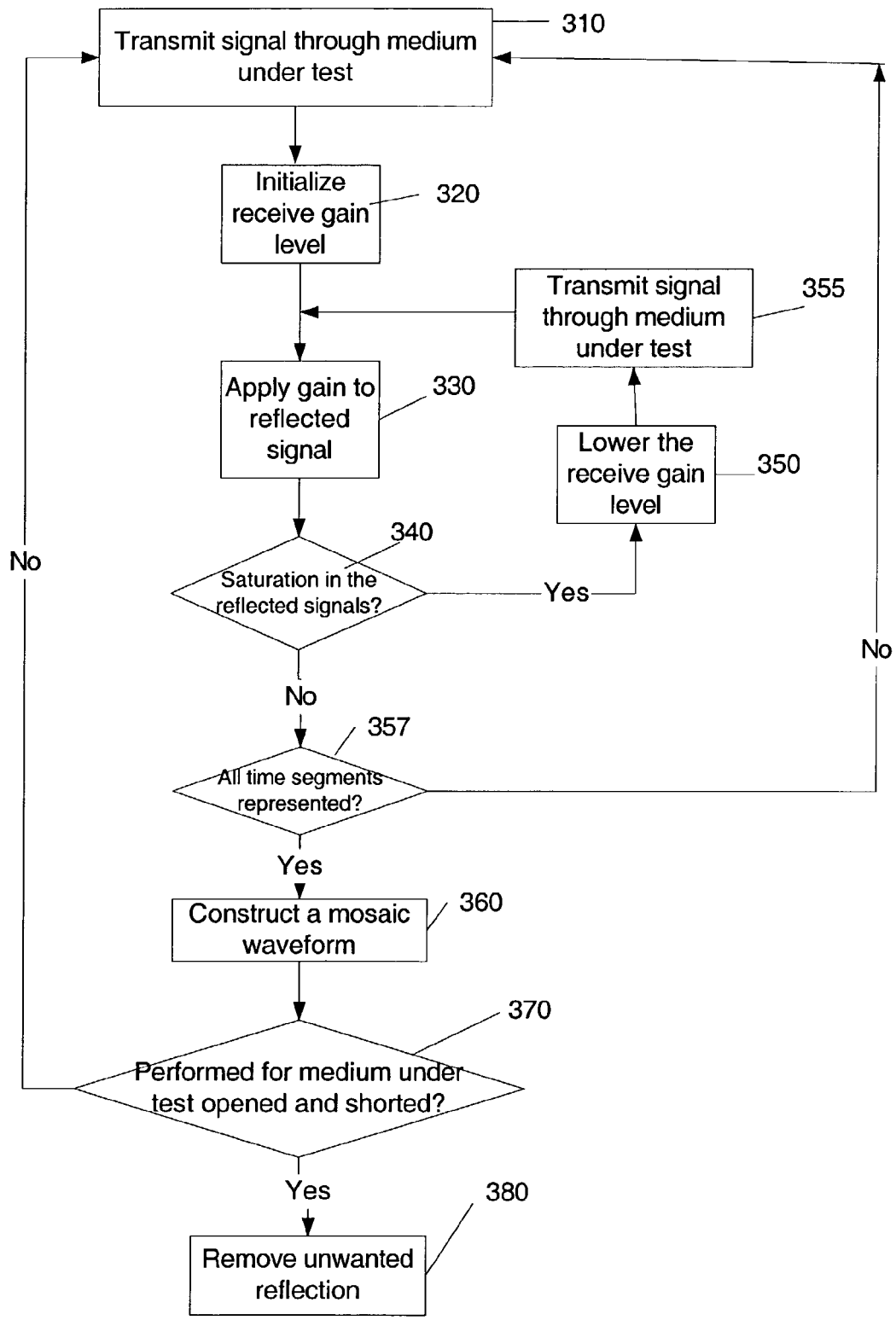
FIG. 3 depicts one possible flow diagram in accordance with an embodiment of the present invention.

In accordance with an embodiment of the present invention, FIG. 3 depicts one possible flow diagram of a process to determine characteristics of a signal propagation medium (e.g., medium-under-test), such as, for example, a twisted pair copper cable, coaxial cable, power transmission line, fiber optic cable, or other signal propagation medium.

In action 310, the process may transmit one or more test signals through the medium-under-test. In action 320, the process may initialize to a highest available gain level a gain level applied to a signal reflected by the medium-under-test in response to a transmitted test signal. In action 330, the process may apply the gain level set in action 320 to received reflected signals. In action 340, the process may determine whether the gain boosted signals determined in action 330 saturated during a time segment of interest. If the gain boosted signals saturated during the time segment of interest, action 350 may follow action 340. If the gain boosted signals did not saturate during a time segment of interest, action 357 may follow action 340.

In action 350, the process may lower the gain level applied to received signals. In action 355, the process may transmit a test signal to the medium-under-test. Actions 330, 340, 350, and 355 may repeat until the gain boosted received reflected signal does not saturate during the time segment of interest.

In action 357, the process may determine whether gain boosted reflected signals for all time segments have been represented. If so, then action 360 may follow. If not, then a time segment of interest may be adjusted to an unrepresented time segment and action 310 may follow.

In action 360, the process may construct a mosaic waveform based on gain boosted reflected signals from all represented time segments. For example, the mosaic waveform may be constructed from different time segments of gain boosted received reflected signals, where each time segment has the highest applied receive gain without saturation during such time segment. For example, the mosaic signal may be similar to that shown in FIG. 2.

In one implementation, the process may average amplitudes of the received reflected signals for the same time segment and same applied gain. For example, a test device may transmit multiple copies of the same test signal to the medium-under-test. The medium-under-test may provide multiple reflected signals based on the multiple test signals. For the time segment of interest, the process may average amplitudes of the multiple reflected test signals. Accordingly, a gain boosted waveform for a time segment may include an average of multiple gain boosted reflected signals. A mosaic signal may be constructed from multiple time segments where each time segment represents an average of multiple gain boosted reflected signals having the same applied gain and based on the same test signal.

In action 370, the process may repeat for both open and shorted circuit configurations of the medium-under-test to generate mosaic signals for both open and shorted circuit configurations. In action 380, the process may remove unwanted bridge tap reflection. For example, an untargeted bridge tap may be a juncture where another modem, whose properties are not being measured, can be connected. Unwanted reflection associated with an untargeted bridged tap may be reflection resulting from the untargeted bridged tap. For example, to remove reflection from the untargeted bridged tap, the process may subtract the mosaic signal determined for a shorted loop configuration from a mosaic signal determined for an open loop configuration. Action 380 may provide a mosaic signal having bridge tap reflection removed.

Accordingly, a resulting mosaic signal can be used to analyze the characteristics of the medium-under-test. For example, TDR may be applied to the mosaic signal to determine the length of the medium-under-test. If the medium-under-test is a pair of twisted copper wires, the thickness of the wires can be determined.

The drawings and the foregoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method capable of examining a signal transmission property of a signal propagation medium comprising:

configuring a medium-under-test in a shorted configuration;

transmitting first and second test signals to the medium-under-test in the shorted configuration;

receiving first and second reflected signals based on the first and second test signals;

applying a first gain level to the first reflected signal, wherein the first reflected signal includes first and second time segments and wherein the first level of gain is approximately a highest level without saturating any of the gain applied first reflected signal during the first time segment;

applying a second gain level to the second reflected signal, wherein the second reflected signal includes first and second time segments and wherein the second level of gain is approximately a highest level without saturating any of the gain applied second reflected signal during the second time segment;

storing a first mosaic signal, wherein the first mosaic signal comprises the first time segment of the gain applied first reflected signal and the second time segment of the gain applied second reflected signal;

configuring the medium-under-test in an open loop configuration;

transmitting third and fourth test signals to the medium-under-test in the open loop configuration;

receiving third and fourth reflected signals based on the third and fourth test signals;

applying the first level of gain to the third reflected signal, wherein the gain applied third reflected signal includes first and second time segments;

applying the second level of gain to the fourth reflected signal, wherein the gain applied fourth reflected signal includes first and second time segments;

storing a second mosaic signal, wherein the second mosaic signal comprises the first time segment of the gain applied third reflected signal and the second time segment of the gain applied fourth reflected signal; and removing reflection arising from at least one untargeted bridge tap, wherein the removing comprises subtracting the first mosaic signal from the second mosaic signal.

2. The method of claim 1, wherein the applying the first gain level further comprises initializing the first gain level to approximately a highest level and selectively lowering the first gain level in response to any of the gain applied first signal saturating during the first time segment.

3. The method of claim 1, wherein the applying the second gain level further comprises initializing the second gain level to approximately a highest level and selectively lowering the second gain level in response to any of the gain applied second signal saturating during the second time segment.

4. The method of claim 1, further comprising initializing the first and second gain levels to highest levels.

5. The method of claim 1, wherein the at least one untargeted bridge tap comprises a central office bridge tap.

6. The method of claim 1, wherein the at least one untargeted bridge tap comprises a modem bridge tap.

7. An apparatus capable of examining a signal transmission property of a signal propagation medium comprising:
 a test signal generator to transmit first and second test signals to a medium-under-test in a shorted configuration and to transmit third and fourth test signals to the medium-under-test in an open loop configuration;
 a receiver to receive first and second reflected signals based on the transmitted first and second test signals and to receive third and fourth reflected signals based on the transmitted third and fourth test signals, wherein
  the receiver is to apply a first level of gain to the first reflected signal, wherein the first reflected signal includes first and second time segments and wherein the first level of gain is approximately a highest level without saturating any of the gain applied first reflected signal during the first time segment,
  the receiver is to apply a second level of gain to the second reflected signal, wherein the second reflected signal includes first and second time segments and wherein the second level of gain is a highest level without saturating any of the gain applied second reflected signal during the second time segment,
  the receiver is to apply the first level of gain to the third reflected signal, wherein the gain applied third reflected signal includes first and second time segments,
  the receiver is to apply the second level of gain to the fourth reflected signal, wherein the gain applied fourth reflected signal includes first and second time segments, wherein the receiver comprises:
   a storage device to store a mosaic signal and a second mosaic signal, wherein the mosaic signal comprises the first time segment of the gain applied first signal and the second time segment of the gain applied second signal and wherein the second mosaic signal comprises the first time segment of the gain applied third reflected signal and the second time segment of the gain applied fourth reflected signal, and
  the receiver is to remove reflection arising from at least one untargeted bridge based in part on subtraction of the first mosaic signal from the second mosaic signal.

8. The apparatus of claim 7, wherein the receiver comprises:
 a programmable gain stage, wherein the programmable gain stage is to initialize the first level of gain to approximately a highest level and selectively lower the first level of gain in response to any of the gain applied first reflected signal saturating during the first time segment and the programmable gain stage is to initialize the second level of gain to approximately a highest level and selectively lower the second level of gain in response to any of the gain applied second reflected signal saturating during the second time segment.

9. The apparatus of claim 7, wherein the at least one untargeted bridge tap comprises a central office bridge tap.

10. The apparatus of claim 7, wherein the at least one untargeted bridge tap comprises a modem bridge tap.

11. An apparatus capable of examining a signal transmission property of a signal propagation medium comprising:
 logic to transmit test signals to a medium-under-test in a shorted configuration and in an open loop configuration;
 logic to receive reflected signals based on the transmitted test signals, wherein the logic to receive is to:
  generate a first mosaic signal based on reflected signals from test signals transmitted to the medium-under-test in a shorted configuration,
  generate a second mosaic signal based on reflected signals from test signals transmitted to the medium-under-test in an open loop configuration, and
  remove reflection arising from at least one untargeted bridge based on in part on the first and second mosaic signals, wherein each mosaic signal comprises multiple time segments and wherein the logic to receive is to apply a maximum gain to each of the multiple time segments without causing saturation.

12. The apparatus of claim 11, wherein the logic to receive is to initialize a gain level for a time segment to approximately a highest level and selectively lower the gain level in response to saturation during the time segment.

13. The apparatus of claim 11, wherein the at least one untargeted bridge tap comprises a central office bridge tap.

14. The apparatus of claim 11, wherein the at least one untargeted bridge tap comprises a modem bridge tap.

15. A method capable of examining a signal transmission property of a signal propagation medium comprising:
 transmitting test signals to a medium-under-test in a shorted configuration and in an open loop configuration;
 receiving reflected signals based on the transmitted test signals, wherein the receiving comprises:
  generating a first mosaic signal based on reflected signals from test signals transmitted to the medium-under-test in a shorted configuration,
  generating a second mosaic signal based on reflected signals from test signals transmitted to the medium-under-test in an open loop configuration, and
  removing reflection arising from at least one untargeted bridge based on in part on the first and second mosaic signals, wherein
   each mosaic signal comprises multiple time segments and wherein the receiving further comprises applying a maximum gain to each of the multiple time segments without causing saturation.

16. The method of claim 15, wherein the receiving further comprises initializing a gain level for a time segment to approximately a highest level and selectively lowering the gain level in response to saturation during the time segment.

17. The method of claim 15, wherein the at least one untargeted bridge tap comprises a central office bridge tap.

18. The method of claim 15, wherein the at least one untargeted bridge tap comprises a modem bridge tap.

* * * * *